(12) United States Patent
Yang (10) Patent No.: US 11,935,829 B2
(45) Date of Patent: Mar. 19, 2024

(54) RESISTOR WITHIN A VIA

(71) Applicant: Taiwan Semiconductor Manufacturing Company, Ltd., Hsinchu (TW)

(72) Inventor: Chi-Han Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 263 days.

(21) Appl. No.: 17/446,405

(22) Filed: Aug. 30, 2021

(65) Prior Publication Data

US 2023/0061124 A1 Mar. 2, 2023

(51) Int. Cl.
| | |
|---|---|
| *H01L 23/522* | (2006.01) |
| *H01L 21/321* | (2006.01) |
| *H01L 21/768* | (2006.01) |
| *H01L 23/532* | (2006.01) |
| *H01L 49/02* | (2006.01) |

(52) U.S. Cl.
CPC ...... *H01L 23/5228* (2013.01); *H01L 21/3212* (2013.01); *H01L 21/76877* (2013.01); *H01L 23/5226* (2013.01); *H01L 23/53257* (2013.01); *H01L 28/24* (2013.01)

(58) Field of Classification Search
CPC ............. H01L 23/5228; H01L 21/3212; H01L 21/76877; H01L 23/5226; H01L 23/53257; H01L 28/24
See application file for complete search history.

(56) References Cited

U.S. PATENT DOCUMENTS

| | | | |
|---|---|---|---|
| 2015/0069574 A1* | 3/2015 | Tseng ................ | H01L 21/76846 438/384 |
| 2022/0108980 A1* | 4/2022 | Feng ................... | H01L 27/0682 |
| 2022/0123100 A1* | 4/2022 | Mitsuiki ................ | H01L 28/24 |
| 2023/0097408 A1* | 3/2023 | Ito .......................... | H01C 1/142 438/384 |

* cited by examiner

*Primary Examiner* — David Vu
*Assistant Examiner* — Brandon C Fox
(74) *Attorney, Agent, or Firm* — Harrity & Harrity, LLP (57) ABSTRACT

In some implementations, one or more semiconductor processing tools may form a via for a semiconductor device. The one or more semiconductor processing tools may deposit a metal plug within the via. The one or more semiconductor processing tools may deposit an oxide-based layer on the metal plug within the via. The one or more semiconductor processing tools may deposit a resistor on the oxide-based layer within the via. The one or more semiconductor processing tools may deposit a first landing pad and a second landing pad on the resistor within the via. The one or more semiconductor processing tools may deposit a first metal plug on the first landing pad and a second metal plug on the second landing pad.

20 Claims, 7 Drawing Sheets

RESISTOR WITHIN A VIA

BACKGROUND

A semiconductor device may include a resistor to apply electrical resistance based on application of a voltage difference across electrodes that are coupled to ends of the resistor. The resistor may be configured with a landing pad (e.g., to provide coupling to a metal plug) defined within an intermetal dielectric material of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may include a resistor to apply electrical resistance based on application of a voltage difference across electrodes that are coupled to ends of the resistor. The resistor may be configured with a landing pad (e.g., to provide coupling to a metal plug) defined within an intermetal dielectric material of the semiconductor device.

The semiconductor device may also include a via defined within the semiconductor device. The via may include a recess from an upper surface of the semiconductor device. For example, the via may include a recess defined within the intermetal dielectric material. A structure within the via may include multiple layers, such as a metal plug to provide electrical coupling to another material within the semiconductor device or to another semiconductor device.

The resistor and the via may be formed at different layers in the intermetal dielectric material of the semiconductor device. For the resistor and the via to function properly, one or more semiconductor manufacturing tools may fine tune an inter-via to land on the resistor (e.g., at the landing pad) and the intermetal dielectric material at the same time.

In some cases, manufacturing a semiconductor device that includes a via and a resistor may be a complex process with a relatively high error rate. For example, one or more semiconductor manufacturing devices may have a relatively high error rate when attempting to fine tune an inter-via to land on a resistor of a semiconductor device and an intermetal dielectric material at the same time. Additionally, or alternatively, the manufacturing process may include a relatively high number of masking and etching operations to form the via and the resistor at different depths of the semiconductor device, which may decrease manufacturing efficiency and increase manufacturing cycle times.

Some implementations described herein provide techniques and apparatuses for disposing a resistor within a via of a semiconductor device. In some implementations, the semiconductor device may include a metal plug (e.g., a metal layer) within a via of the semiconductor device and an oxide-based layer on the metal plug within the via. The oxide-based layer may provide electrical insulation from the metal plug within the via. The semiconductor device may also include a resistor on the oxide-based layer within the via and a first landing pad and a second landing pad on the resistor. The semiconductor device may further include a first metal plug on the first landing pad and a second metal plug on the second landing pad to provide an electrical connection to the landing pads and through the resistor. Based on the resistor being disposed within the via, a process of manufacturing the semiconductor device may have a reduced number of operations, a reduced complexity of operations (e.g., by increasing a manufacturing tolerance), a reduced process cost, and/or a shorter manufacturing time when compared to a process of manufacturing a semiconductor device with a resistor disposed outside of the via (e.g., at a different layer within an intermetal dielectric material outside of the via).

Figure 1:
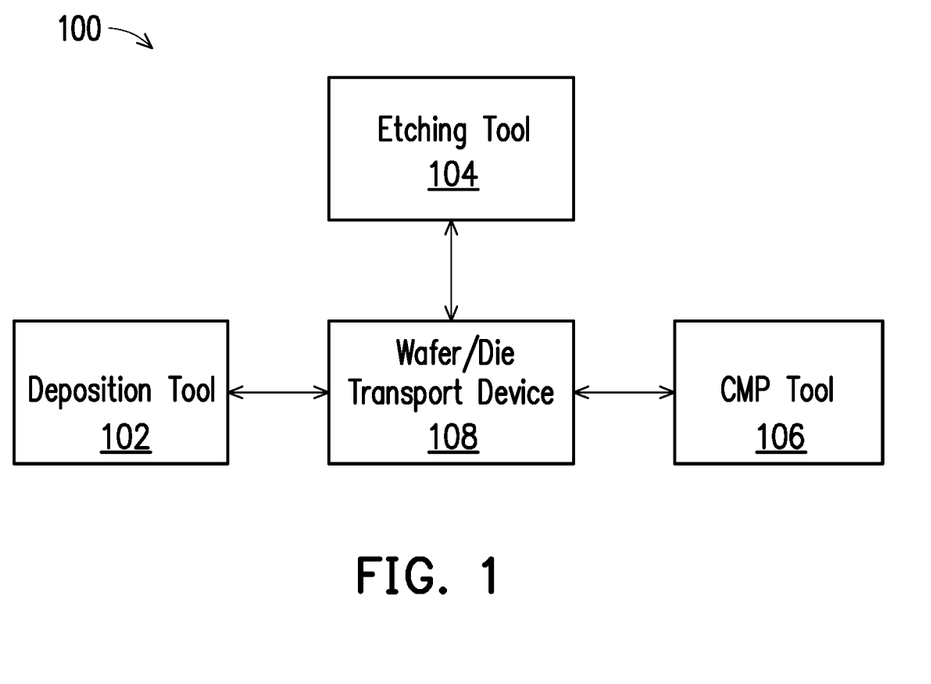
FIG. 1 is a diagram of an example environment in which systems and/or methods described herein may be implemented.

FIG. 1 is a diagram of an example environment 100 in which systems and/or methods described herein may be implemented. As shown in FIG. 1, environment 100 may include a plurality of semiconductor processing tools 102-106 and a wafer/die transport device 108. The plurality of semiconductor processing tools 102-106 may include a deposition tool 102, an etching tool 104, and/or a chemical-mechanical polishing (CMP) tool 106, among other examples. The semiconductor processing tools included in example environment 100 may be included in a semiconductor clean room, a semiconductor foundry, and/or a semiconductor processing and/or manufacturing facility, among other examples.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching (e.g., removing) various types of materials of a substrate, wafer, or semiconductor device. For example, etching tool 104 may include a wet etching tool, a dry etching tool, a laser etching tool, a chemical etching tool, a plasma etching tool, a reactive ion etching tool, a sputter etching tool, and/or a vapor phase etching tool, among other examples. A wet etching tool may include a chamber that is filled with an etchant, and the substrate may be placed in the chamber for a particular time period to remove particular amounts of one or more portions of the substrate. A dry etching tool may remove one or more portions of the substrate using a plasma etch technique (e.g., a plasma sputtering technique) and/or a plasma-assisted etch, which may involve using an ionized gas to isotopically or directionally etch the one or more portions. In some implementations, etching tool 104 may remove a layer from a semiconductor device as described herein.

CMP tool 106 is a semiconductor processing tool that includes one or more devices capable of polishing or planarizing various layers of a wafer or semiconductor device. In some implementations, CMP tool 106 may polish or planarize a layer of deposited or plated material. The CMP tool 106 may polish or planarize a surface of a semiconductor device with a combination of chemical and mechanical forces (e.g., chemical etching and free abrasive polishing). The CMP tool may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Wafer/die transport device 108 includes a mobile robot, a robot arm, a tram or rail car, and/or another type of device that is used to transport wafers and/or dies between semiconductor processing tools 102-106 and/or to and from other locations such as a wafer rack, or a storage room, among other examples. In some implementations, wafer/die transport device 108 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2F are diagrams of one or more example implementations described herein. Example implementation(s) may include one or more example implementations of a process for manufacturing a semiconductor device 200, as described herein. In some implementations, example implementation(s) may include a process of manufacturing the semiconductor device 200 with a resistor formed within a via of the semiconductor device 200.

Figure 2A:
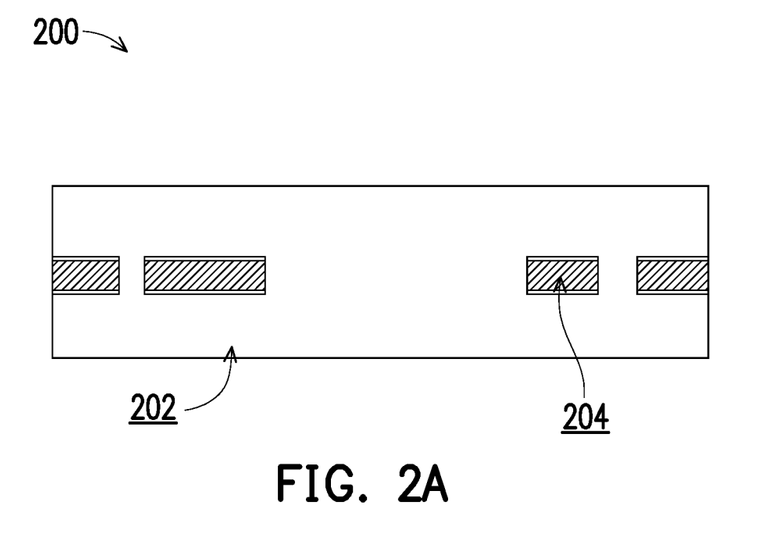
FIGS. 2A-2F are diagrams illustrating a sequence of operations for manufacturing a semiconductor device, as described herein.

As shown in FIG. 2A, the semiconductor device 200 may include an intermetal dielectric (IMD) material 202 with one or more metal electrodes 204 disposed within the IMD material 202 (e.g., below an upper surface of the IMD material and/or above a lower surface of the IMD material). In some implementations, a deposition tool (e.g., deposition tool 102) may deposit the IMD material 202 onto a substrate of the semiconductor device 200. In some implementations, the deposition tool may use high density plasma deposition, plasma-enhanced chemical vapor deposition, chemical vapor deposition, or physical vapor deposition, among other examples, to deposit the IMD material 202 onto the semiconductor device 200. In some aspects, the IMD material 202 may include silicon rich oxide material and/or fluorosilicate glass, among other examples.

In some implementations, the deposition tool may deposit a layer of metal material on an upper surface of a first portion of the IMD material 202 and an etching tool (e.g., etching tool 104) may etch (e.g., remove) a portion of the layer of metal material to form the one or more metal electrodes 204. The deposition tool may deposit additional IMD material between, and on, the one or more metal electrodes 204 to form the semiconductor device 200 as shown in FIG. 2A.

In some implementations, a CMP tool (e.g., CMP tool 106) may planarize an upper surface of the IMD material 202. In some implementations, the deposition tool may deposit a layer or anti-reflection coating material (e.g., undoped silicate glass) on an upper surface of the IMD material 202 (e.g., after planarization).

Figure 2B:
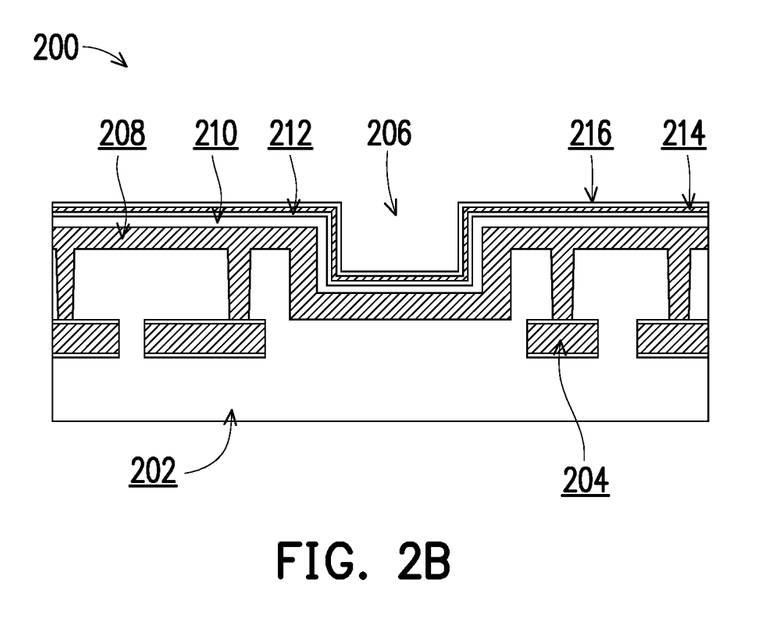

As shown in FIG. 2B, an etching tool (e.g., etching tool 104) may etch a portion of the IMD material 202 to form a via 206 (e.g., a recessed portion of the IMD material 202). The etching tool may also etch one or more additional portions of the IMD material 202 to form additional vias between an upper surface of the IMD material 202 and the one or more metal electrodes 204.

A deposition tool (e.g., deposition tool 102) may deposit one or more layers of material including a metal plug 208, an insulating layer 210, a resistor layer 212, a landing pad layer 214, and/or an oxynitride layer 216. In some implementations, the deposition tool may use high density plasma deposition, plasma-enhanced chemical vapor deposition, chemical vapor deposition, or physical vapor deposition, among other examples, to deposit the one or more layers of material on the semiconductor device 200 and/or within the via 206.

In some implementations, the deposition tool may deposit the one or more layers sequentially. For example, the metal plug 208 may be deposited on the IMD material 202 (e.g., in the via and/or within the additional vias between the upper surface of the IMD material 202 and the one or more metal electrodes 204). In some implementations, the metal plug 208 may fill the additional vias between the upper surface of the IMD material 202 and the one or more metal electrodes 204. In some implementations, the metal plug 208 may be deposited within the via 206 (e.g., on sidewalls and on a bottom surface of the via 206). For example, the deposition tool may deposit the metal plug 208 to fill the additional vias between the upper surface of the IMD material 202 and the one or more metal electrodes 204 and to cover surfaces of the via 206. A CMP tool (e.g., CMP tool 106) may planarize an upper surface of the metal plug 208 and/or an etching tool (e.g., etching tool 104) may etch a portion of the metal plug 208 within the via 206.

The deposition tool may deposit the insulating layer 210 on the metal plug 208, the resistor layer 212 on the insulating layer 212, the landing pad layer 214 on the resistor layer 212, and/or the oxynitride layer 216 on the landing pad layer 214. The deposition tool may deposit the insulating layer 210, the resistor layer 212, the landing pad layer 214, and/or the oxynitride layer 216 within the via 206 and/or outside of the via (e.g., on an upper surface of the semiconductor device 200 and/or an upper surface of the metal plug 208). In some implementations, the insulating layer 210, the resistor layer 212, the landing pad layer 214, and/or the oxynitride layer 216 may have approximately uniform thicknesses within the via 206 and outside of the via 206.

In some implementations, the layers may be arranged differently from the described arrangement, one or more described layers may be omitted, and/or additional layers may be added (e.g., an adhesive layer) between the described layers. For example, the deposition tool may deposit an adhesive layer (e.g., titanium nitride-based material) on the IMD material 202 before depositing the metal plug 208 to improve bonding, and/or reduce peeling, of the metal plug 208 within the via 206.

In some implementations, the metal plug 208 may include a tungsten-based material. The metal plug 208 may provide isolation (e.g., electrical insulation) of the resistor layer 212 from the IMD material 202. In some implementations, the insulating layer 210 may include an oxide-based material (e.g., silicon-rich oxide). The insulating layer 210 (e.g., an oxide-based layer) may provide a buffer and/or electrical insulation between the metal plug 208 and the resistor layer 212. In some implementations, the resistor layer 212 may include a silicon chromium-based material. In some implementations, the landing pad layer 214 may include a metal material, such as a titanium nitride-based material. The landing pad layer 214 may provide a connection to the resistor layer 212. In this way, a metal material may be disposed within the landing pad layer 214 to establish an electrical connection to the resistor layer 212 without the metal material being disposed within a portion of the resistor layer 212. In some implementations, the oxynitride layer 216 may include a silicon oxynitride-based material. The oxynitride layer may provide a bottom antireflective coating for deep ultraviolet lithography to reduce and/or eliminate substrate reflection during a photoresist exposure operation (e.g., during an etching operation).

Figure 2C:
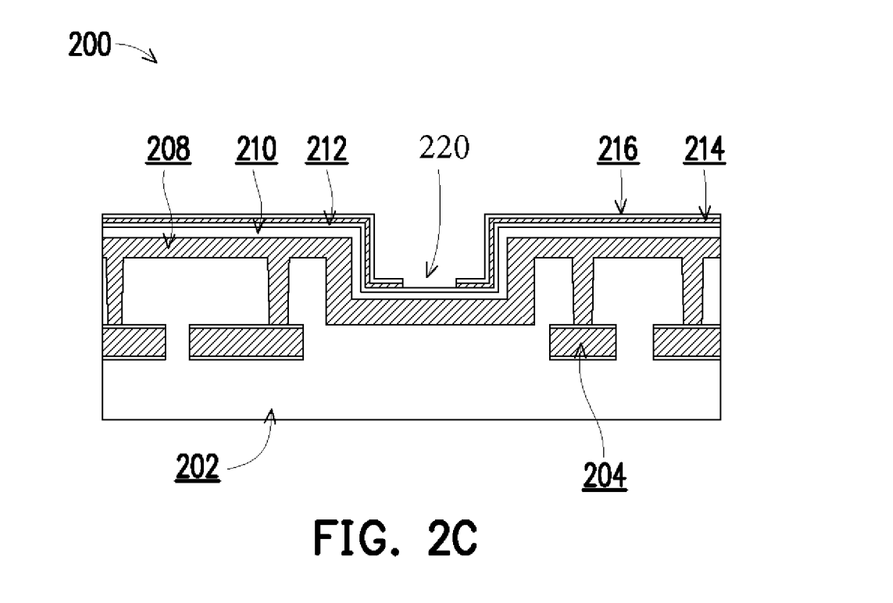

As shown in FIG. 2C, an etching tool (e.g., etching tool 104) may etch a portion of the landing pad layer 214 and the oxynitride layer 216 at an etched portion 220 within the via 206 to form two separate portions of the landing pad layer 214 and the oxynitride layer 216 within the via 206. As part of etching the etched portion 220, a deposition tool (e.g., deposition tool 102) may deposit a photoresist on an upper surface of the semiconductor device, excluding the etched portion 220, before the etching tool performs one or more etching operations. In this way, the one or more etching operations may remove material from the etched portion 220 (e.g., and not outside of the etched portion 220). In some implementations, the etching tool may perform an additional etching operation to remove the photoresist.

In some implementations, the two separate portions of the landing pad layer 214 and the oxynitride layer 216 may include a first portion that is approximately parallel to the upper surface of the semiconductor device 200 and a second portion that is approximately parallel to the upper surface of the semiconductor device 200. In some implementations, the etching tool may perform a landing pad break through (e.g., a titanium nitride breakthrough) operation, a cleaning operation (e.g., a post-etch residual polymer removal operation, a post-etch residual photoresist removal operation, or an EKC cleaning operation, among other examples) to remove irregularities from an upper surface of the landing pad layer 214 and/or the oxynitride layer 216, and/or a landing pad wet etch process, among other examples, to etch the portion of the landing pad layer 214 and the oxynitride layer 216. After etching, a first portion of the landing pad layer 214 and a second portion of the landing pad layer 214 may be electrically isolated within the via 206.

Figure 2D:
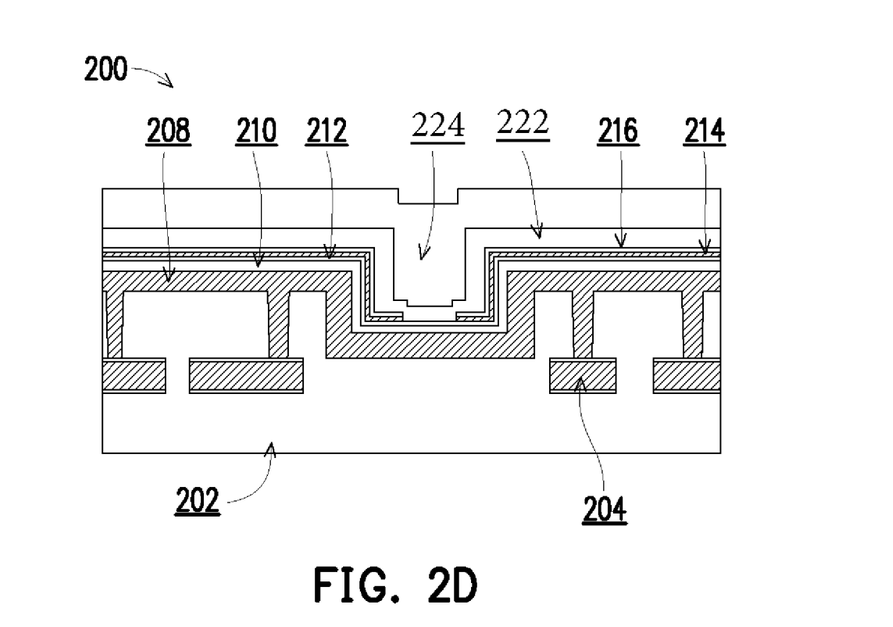

As shown in FIG. 2D, a deposition tool (e.g., deposition tool 102) may deposit an insulating layer 222 (e.g., an oxide-based layer) and/or a dielectric material 224 (e.g., additional IMD material) on an upper surface of the semiconductor device 200 (including within the via 206) and may deposit the dielectric material 224 on the insulating material 222 (e.g., within the via 206 and/or outside of the via 206). For example, the deposition tool may deposit the insulating layer 222 on the oxynitride layer 216 (e.g., within the via 206 and/or outside of the via 206) and onto the resistor layer 212 at the etched portion 220 within the via 206. In some implementations, the insulating layer 222 may have an approximately uniform thickness within the via 206 and outside of the via 206. In some implementations, the dielectric material 222 may substantially fill the via 206 to at least an upper surface of the insulating layer 222 outside of the via 206.

In some implementations, the deposition tool may use high density plasma deposition, plasma-enhanced chemical vapor deposition, chemical vapor deposition, or physical vapor deposition, among other examples, to deposit the insulating layer 222 and/or the dielectric material 224. The insulating layer 222 may provide a buffer and/or electrical insulation between the resistor layer 212 and the dielectric material 224. In some implementations, the insulating layer 222 may include an oxide-based material (e.g., silicon-rich oxide).

Figure 2E:
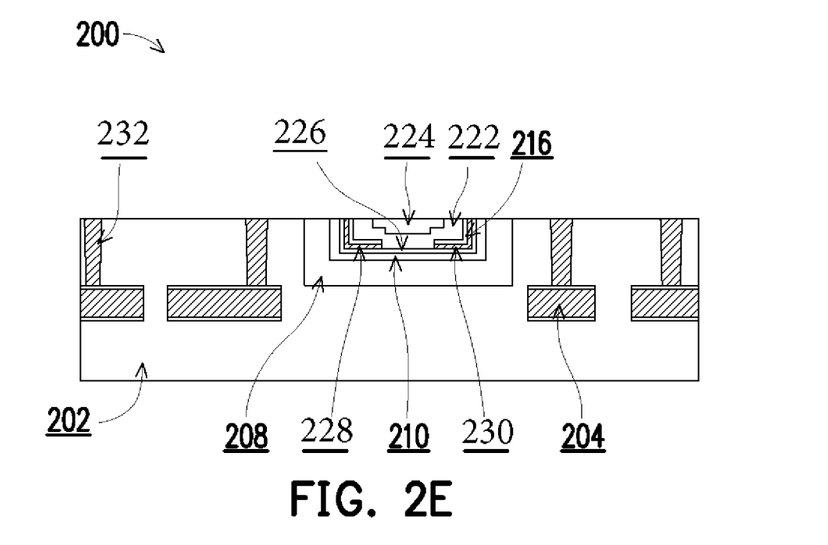

As shown in FIG. 2E, a CMP tool (e.g., CMP tool 106) may planarize the upper surface of the semiconductor device 200 to remove one or more materials. In some implementations, the CMP tool may planarize the upper surface of the semiconductor device 200 using one or more CMP operations. For example, the CMP tool may planarize the insulating layer 222 and the dielectric material 224 to remove layers of material above the metal plug 208 on the upper surface of the semiconductor device 200 in a first operation. In some implementations, the first operation may include removing all material above the metal plug 208 from the upper surface of the semiconductor device 200 so that only the metal plug 208 is disposed above an upper surface of the IMD material 202 (e.g., outside of the via 206 and the additional vias between the upper surface of the IMD material 202 and the one or more metal electrodes 204). Additionally, or alternatively, the CMP tool may planarize the metal plug 208 in a second operation. In some implementations, the second operation may include removing the metal plug 208 from the upper surface of the semiconductor device 200 so that none of the metal plug 208 is disposed above the upper surface of the IMD material 202 outside of the via 206 and the additional vias between the upper surface of the IMD material 202 and the one or more metal electrodes 204. In some implementations, the first operation and the second operation are part of the same CMP operation (e.g., a single CMP operation planarizes the metal plug 208 and layers of material above the metal plug 208 on the upper surface of the semiconductor device 200).

As also shown in FIG. 2E, the CMP tool may form a resistor 226 based on removing a portion of the resistor layer 212 from outside of the via 206. The CMP tool may also form a first landing pad 228 and a second landing pad 230 within the via 206 based on removing a portion of the landing pad layer 214 from outside of the via 206. The first landing pad 228 and the second landing pad 230 may be electrically coupled through the resistor 226.

As further shown in FIG. 2E, the CMP tool may form separated metallic plugs 232 (e.g., from the metal plug 208) in the additional vias (e.g., outside of the via 206) based on removing a portion of the metal plug 208 from an upper surface of the IMD material 202. The additional vias may connect the upper surface of the semiconductor device 200 to the one or more metal electrodes 204 within the IMD material 202. The metallic plugs 232 in the additional vias may provide isolated electrical connections to the one or more metal electrodes 204.

Figure 2F:
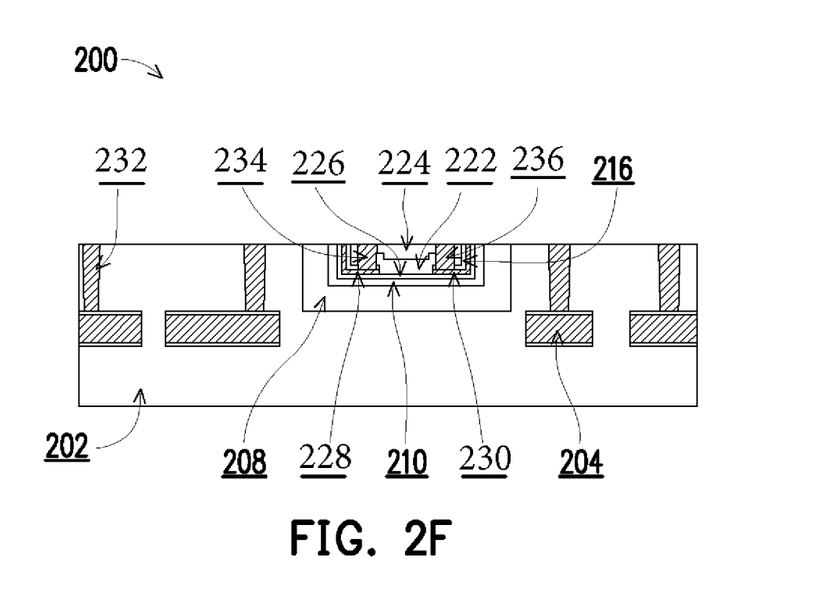

As shown in FIG. 2F, an etching tool (e.g., etching tool 104) may etch a portion of the dielectric material 224, a portion of the insulating layer 222, a portion of the oxynitride layer 216, a portion of the first landing pad 228, and/or a portion of the second landing pad 230, among other examples, to form a first resistor via and a second resistor via within the via 206. The first resistor via and the second resistor via may connect the first landing pad 228 and the second landing pad 230, respectively, to the upper surface of the semiconductor device 200. A deposition tool (e.g., deposition tool 102) may deposit a first metal plug 234 within the first resistor via to provide an electrical connection from the upper surface of the semiconductor device 200 to the first landing pad 228 and a first portion of the resistor 226. Additionally, the deposition tool may deposit a second metal plug 236 within the second resistor via to provide an electrical connection from the upper surface of the semiconductor device 200 to the second landing pad 230 and a second portion of the resistor 226. In some implementations, the deposition tool may use high density plasma deposition, plasma-enhanced chemical vapor deposition, chemical vapor deposition, or physical vapor deposition, among other examples, to deposit the first metal plug 234 within the first resistor via and/or to deposit the second metal plug 236 within the second resistor via.

In some implementations, a CMP tool (e.g., CMP tool 106) may planarize the upper surface of the semiconductor device 200 after deposition of the first metal plug 234 and the second metal plug 236 to planarize upper surfaces of the first metal plug 234, the second metal plug 236, and the upper surface of the semiconductor device 200 (e.g., the via structure within the via 206 and/or the metallic plugs in the additional vias and the IMD material 202 outside of the via 206).

Based on the resistor 226 being disposed within the via 206 (e.g., at a same layer of the IMD material 202 as the via), a process of manufacturing the semiconductor device 200 may have a reduced process cost and/or a shorter manufacturing time when compared to a process of manufacturing a semiconductor device with a resistor disposed outside of the via 206 (e.g., within an intermetal dielectric material outside of the via) and at a different layer of the IDM material 202 from the via 206.

The number and arrangement of structures and/or layers, among other examples, shown in FIGS. 2A-2F are provided as an example. In practice, a semiconductor device including additional structures and/or layers, fewer structures and/or layers, different structures and/or layers, or differently arranged structures and/or layers than those shown in FIGS. 2A-2F may be processed according to the techniques described above in connection with FIGS. 2A-2F.

Figure 3:
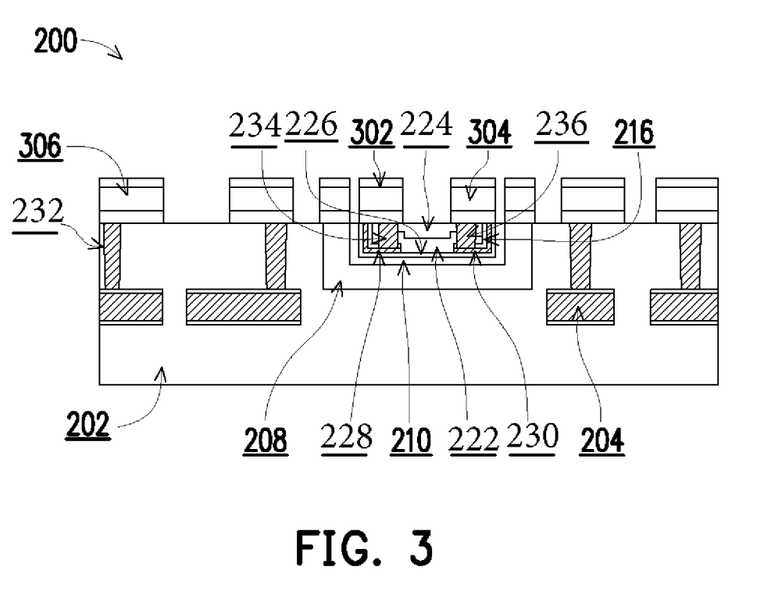
FIG. 3 is a diagram of an example semiconductor device formed based on the example techniques described in connection with FIGS. 2A-2F.

FIG. 3 is a diagram of a semiconductor device 200 formed based on the example techniques described in connection with FIGS. 2A-2F.

As shown in FIG. 3, the semiconductor device 200 may include an IMD material 202 and one or more metal electrodes 204. Within a via (e.g., disposed within the IMD material 202), the semiconductor device 200 may also include a metal plug 208 (e.g., of a metal material, such as tungsten-based material), an insulating layer 210 (e.g., of an oxide-based material) on the metal plug 208, a resistor 226 on the insulating layer 222, a first landing pad 228 and a second landing pad 230 on the resistor 226, a first metal plug 234 on the first landing pad 228, and/or a second metal plug 236 on the second landing pad 230.

In some implementations, the semiconductor device 200 may also include, within the via, an oxynitride layer 216 on a portion of the first landing pad 228 and the second landing pad 230. In some implementations, the semiconductor device 200 may also include, within the via, an insulating layer 222 on a portion of the resistor 226, a portion of the first landing pad 228 and the second landing pad 230, and/or a portion of the oxynitride layer 216. Additionally, or alternatively, the semiconductor device 200 may include, within the via, a dielectric material 224 on a portion of the insulating layer 222.

Additionally, the semiconductor device 200 may include a first metal electrode 302 deposited on the first metal plug 234 and a second metal electrode 304 deposited on the second metal plug 236. In some aspects, the first metal plug 234 may provide electrical coupling of a first portion of the resistor 226 (e.g., via the first landing pad 228) to the first metal electrode 302 (e.g., a first top metal electrode), and the second metal plug 236 may provide electrical coupling of a second portion of the resistor 226 (e.g., via the second landing pad 230) to the second metal electrode 304 (e.g., a second top metal electrode). In this way, the resistor 226 may be configured to provide a resistance based on application of a voltage difference across the first metal electrode 302 and the second metal electrode 304.

In some implementations, the semiconductor device 200 may also include, outside of the via, one or more metallic plugs 232 in additional vias that provide an electrical connection between the one or more metal electrodes 204 and one or more additional metal electrodes 306.

As indicated above, FIG. 3 is provided as an example. Other examples may differ from what is described with regard to FIG. 3.

Figure 4:
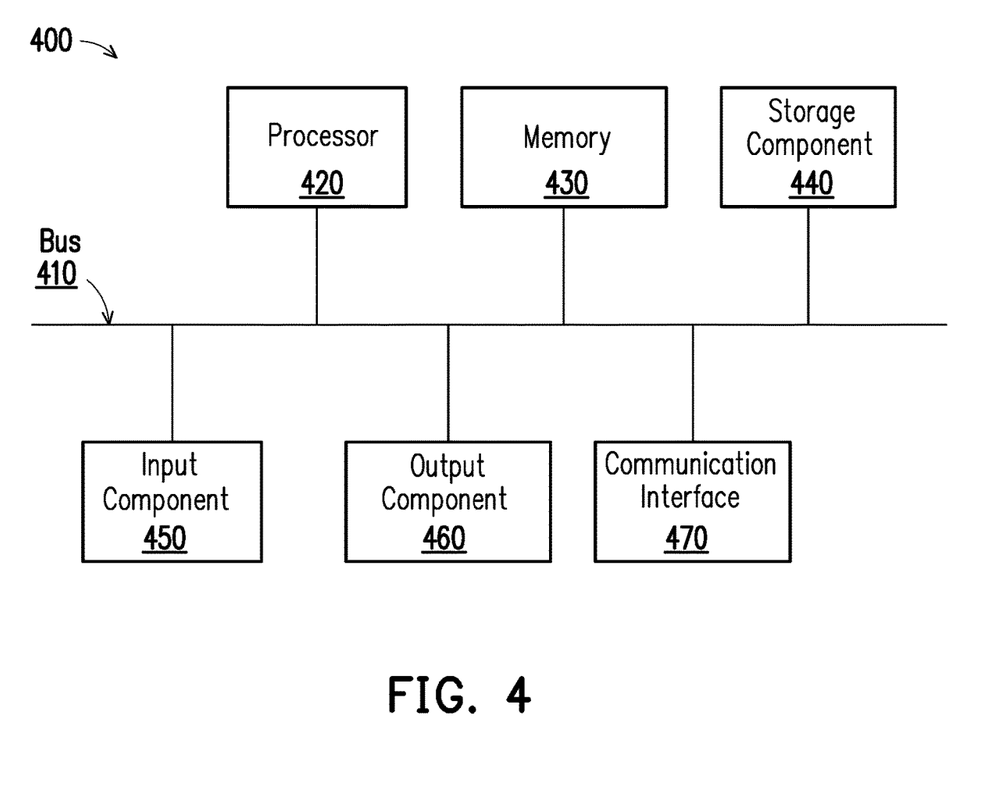
FIG. 4 is a diagram of example components of one or more devices of FIG. 1.

FIG. 4 is a diagram of example components of a device 400. In some implementations, deposition tool 102, etching tool 104, CMP tool 106, and/or wafer/die transport device 108 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator, among other examples. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna, among other examples.

Device 400 may perform one or more processes described herein. For example, a non-transitory computer-readable medium (e.g., memory 430 and/or storage component 440) may store a set of instructions (e.g., one or more instructions, code, software code, and/or program code, among other examples) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
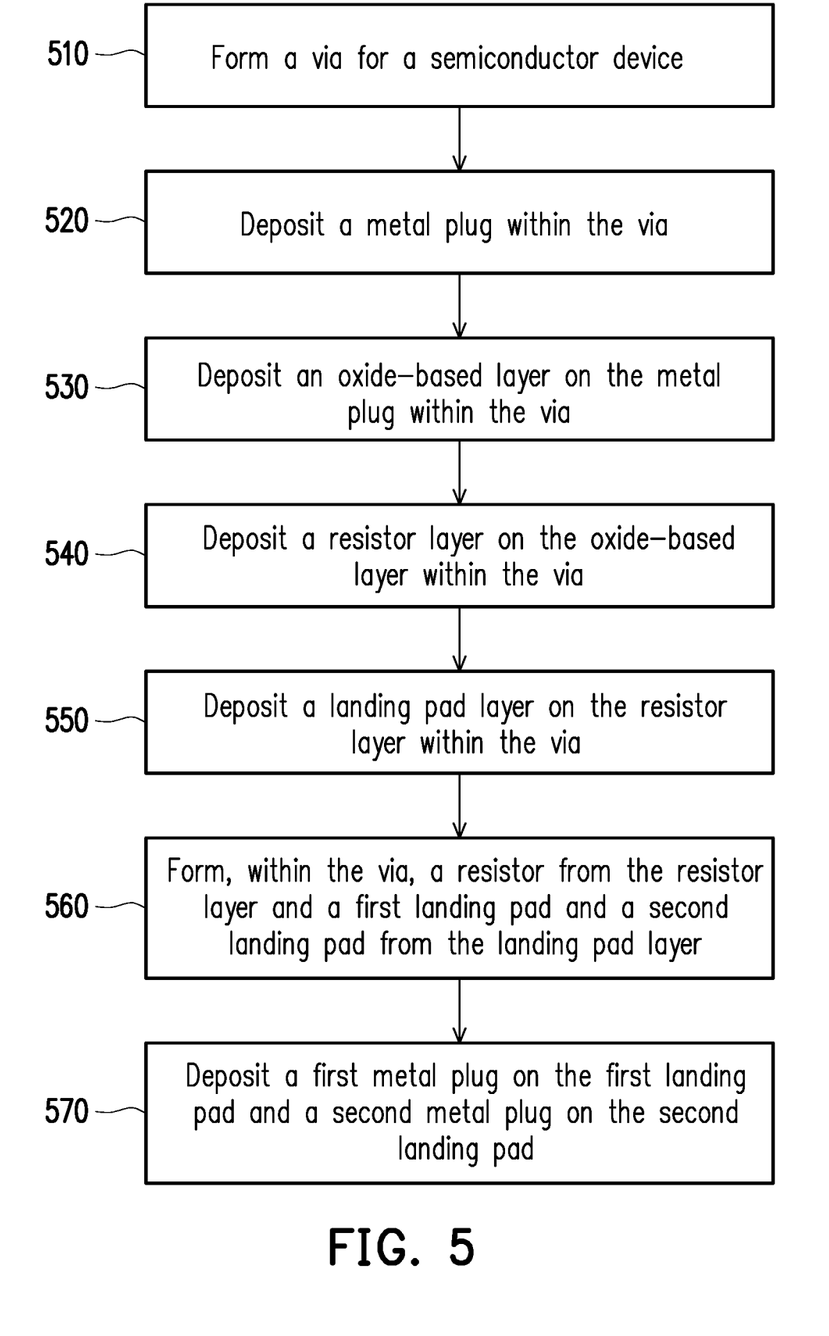
FIG. 5 is a flowchart of an example process of manufacturing a semiconductor device, as described herein.

FIG. 5 is a flowchart of an example process of manufacturing a semiconductor device. In some implementations, one or more process blocks of FIG. 5 may be performed by one or more semiconductor processing tools (e.g., one or more of deposition tool 102, etching tool 104, CMP tool 106, and/or wafer/die transport device 108). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a via for a semiconductor device (block 510). For example, the one or more semiconductor processing tools (e.g., deposition tool 102, etching tool 104, CMP tool 106) may form a via 206 for a semiconductor device 200, as described above.

As further shown in FIG. 5, process 500 may include depositing a metal plug within the via (block 520). For example, the one or more semiconductor processing tools (e.g., deposition tool 102, etching tool 104, CMP tool 106) may deposit a metal plug 208 within the via 206, as described above.

As further shown in FIG. 5, process 500 may include depositing an oxide-based layer on the metal plug within the via (block 530). For example, the one or more semiconductor processing tools (e.g., deposition tool 102, etching tool 104, CMP tool 106) may deposit an oxide-based layer (e.g., insulating layer 210) on the metal plug 208 within the via 206, as described above.

As further shown in FIG. 5, process 500 may include depositing a resistor layer on the oxide-based layer within the via (block 540). For example, the one or more semiconductor processing tools (e.g., deposition tool 102, etching tool 104, CMP tool 106) may deposit a resistor layer 212 on the oxide-based layer (e.g., insulating layer 210) within the via 206, as described above.

As further shown in FIG. 5, process 500 may include depositing a landing pad layer on the resistor layer within the via (block 550). For example, the one or more semiconductor processing tools (e.g., deposition tool 102, etching tool 104, CMP tool 106) may deposit a landing pad layer 214 on the resistor layer 212 within the via 206, as described above.

As further shown in FIG. 5, process 500 may include forming, within the via, a resistor from the resistor layer and a first landing pad and a second landing pad from the landing pad layer (Block 560). For example, the one or more semiconductor processing tools (e.g., deposition tool 102, etching tool 104, CMP tool 106) may form, within the via 206, a resistor 226 from the resistor layer 212 and a first landing pad 228 and a second landing pad 230 from the landing pad layer 214.

As further shown in FIG. 5, process 500 may include depositing a first metal plug on the first landing pad and a second metal plug on the second landing pad (block 570). For example, the one or more semiconductor processing tools may deposit a first metal plug 234 on the first landing pad 228 and a second metal plug 236 on the second landing pad 230, as described above.

Process 500 may include additional implementations, such as any single implementation or any combination of implementations described below and/or in connection with one or more other processes described elsewhere herein.

In a first implementation, process 500 includes depositing, after forming the resistor, the first landing pad and the second landing pad, an additional oxide-based layer on the resistor, the first landing pad and the second landing pad within the via.

In a second implementation, alone or in combination with the first implementation, process 500 includes depositing an oxynitride-based layer on the first landing pad and the second landing pad.

In a third implementation, alone or in combination with one or more of the first and second implementations, forming the first landing pad and the second landing pad comprises etching a portion of the landing pad layer to form the first landing pad and the second landing pad.

In a fourth implementation, alone or in combination with one or more of the first through third implementations, process 500 includes depositing, before depositing the first metal plug and the second metal plug, an intermetal dielectric material within the via, and etching a first portion of the intermetal dielectric material to form a first resistor via for the first metal plug and a second portion of the intermetal dielectric material to form a second resistor via for the second metal plug.

In a fifth implementation, alone or in combination with one or more of the first through fourth implementations, process 500 includes depositing a first metal electrode on the first metal plug and a second metal electrode on the second metal plug.

In a sixth implementation, alone or in combination with one or more of the first through fifth implementations, the resistor is configured to provide a resistance based on application of a voltage difference across the first metal electrode and the second metal electrode.

In a seventh implementation, alone or in combination with one or more of the first through sixth implementations, process 500 includes performing, before depositing the first metal plug and the second metal plug, one or more chemical-mechanical polishing operations.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, based on the resistor being disposed within the via (e.g., at a same layer of the IMD material 202 as the via), a process of manufacturing the semiconductor device may have a reduced process cost and/or a shorter manufacturing time when compared to a process of manufacturing a semiconductor device with a resistor disposed outside of the via 206 (e.g., within an intermetal dielectric material outside of the via) and at a different layer of the IDM material 202 from the via 206.

As described in greater detail above, some implementations described herein provide a method. The method includes forming a via for a semiconductor device. The method includes depositing a metal plug within the via. The method includes depositing an oxide-based layer on the metal plug within the via. The method includes depositing a resistor on the oxide-based layer within the via. The method includes depositing a first landing pad and a second landing pad on the resistor within the via. The method includes depositing a first metal plug on the first landing pad and a second metal plug on the second landing pad.

As described in greater detail above, some implementations described herein provide a semiconductor device. The semiconductor device includes a metal plug within a via of the semiconductor device. The semiconductor device includes an oxide-based layer on the metal plug within the via. The semiconductor device includes a resistor on the oxide-based layer within the via. The semiconductor device includes a first landing pad and a second landing pad on the resistor within the via. The semiconductor device includes a first metal plug on the first landing pad and a second metal plug on the second landing pad.

As described in greater detail above, some implementations described herein provide a semiconductor device. The semiconductor device includes a via that includes a metal plug; an insulating layer on the metal plug within the via; a resistor on the insulating layer within the via; a first landing pad and a second landing pad on the resistor within the via; and a first metal plug on the first landing pad and a second metal plug on the second landing pad. The semiconductor device includes a first top metal electrode on the first metal plug. The semiconductor device includes a second top metal electrode on the second metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a via for a semiconductor device;
    depositing a metal plug within the via;
    depositing an oxide-based layer on the metal plug within the via;
    depositing a resistor layer on the oxide-based layer within the via;
    depositing a landing pad layer on the resistor layer within the via;
    forming, within the via, a resistor from the resistor layer and a first landing pad and a second landing pad from the landing pad layer; and
    depositing a first metal plug on the first landing pad and a second metal plug on the second landing pad.

2. The method of claim 1, further comprising:
    depositing, after forming the resistor, the first landing pad and the second landing pad, an additional oxide-based layer on the resistor, the first landing pad and the second landing pad within the via.

3. The method of claim 1, further comprising:
    depositing an oxynitride-based layer on the first landing pad and the second landing pad.

4. The method of claim 1, wherein forming the first landing pad and the second landing pad comprises:
    etching a portion of the landing pad layer to form the first landing pad and the second landing pad.

5. The method of claim 1, further comprising:
    depositing, before depositing the first metal plug and the second metal plug, an intermetal dielectric material within the via; and
    etching a first portion of the intermetal dielectric material to form a first resistor via for the first metal plug and a second portion of the intermetal dielectric material to form a second resistor via for the second metal plug.

6. The method of claim 1, further comprising:
    depositing a first metal electrode on the first metal plug and a second metal electrode on the second metal plug.

7. The method of claim 6, wherein the resistor is configured to provide a resistance based on application of a voltage difference across the first metal electrode and the second metal electrode.

8. The method of claim 1, further comprising:
    performing, before depositing the first metal plug and the second metal plug, one or more chemical-mechanical polishing operations.

9. A semiconductor device comprising:

a metal plug within a via of the semiconductor device;

an oxide-based layer on the metal plug within the via;

a resistor on the oxide-based layer within the via;

a first landing pad and a second landing pad on the resistor within the via; and a first metal plug on the first landing pad and a second metal plug on the second landing pad.

10. The semiconductor device of claim 9, wherein the via is disposed within an intermetal dielectric material.

11. The semiconductor device of claim 10, further comprising:

one or more additional vias that connect an upper surface of the semiconductor device to one or more metal electrodes within the intermetal dielectric material, wherein the one or one or more metal electrodes are outside of the via.

12. The semiconductor device of claim 10, wherein the metal plug provides isolation of the resistor from the intermetal dielectric material.

13. The semiconductor device of claim 9, wherein the first metal plug provides electrical coupling of a first portion of the resistor to a first top metal electrode, and wherein the second metal plug provides electrical coupling of a second portion of the resistor to a second top metal electrode.

14. A semiconductor device comprising:

a via that comprises:

a metal plug;

an insulating layer on the metal plug within the via;

a resistor on the insulating layer within the via;

a first landing pad and a second landing pad on the resistor within the via; and a first metal plug on the first landing pad and a second metal plug on the second landing pad;

a first top metal electrode on the first metal plug; and a second top metal electrode on the second metal plug.

15. The semiconductor device of claim 14, wherein one or more of the metal plug, the first metal plug, or the second metal plug comprise a tungsten-based material.

16. The semiconductor device of claim 14, wherein the first landing pad and the second landing pad comprise a titanium nitride-based material.

17. The semiconductor device of claim 14, wherein the resistor comprises a silicon chromium-based material.

18. The semiconductor device of claim 14, further comprising:

an additional oxide-based layer on a portion of the resistor between the first landing pad and the second landing pad within the via.

19. The semiconductor device of claim 18, further comprising:

a dielectric material on the additional oxide-based layer within the via.

20. The semiconductor device of claim 14, wherein the metal plug provides isolation of the resistor from an intermetal dielectric material of the semiconductor device.

* * * * *